US007287237B2

(12) United States Patent
Morton

(10) Patent No.: US 7,287,237 B2
(45) Date of Patent: Oct. 23, 2007

(54) ALIGNED LOGIC CELL GRID AND INTERCONNECT ROUTING ARCHITECTURE

(75) Inventor: Shannon Vance Morton, Redland (GB)

(73) Assignee: Icera Inc., Almondsbury, Bristol (GB)

( * ) Notice: Subject to any disclaimer, the term of this patent is extended or adjusted under 35 U.S.C. 154(b) by 62 days.

(21) Appl. No.: 11/066,041

(22) Filed: Feb. 24, 2005

(65) Prior Publication Data

US 2006/0195810 A1 Aug. 31, 2006

(51) Int. Cl.
*G06F 17/50* (2006.01)
(52) U.S. Cl. .............................. 716/14; 716/2; 716/12
(58) Field of Classification Search ............... 716/1–3, 716/8–16; 703/1–3
See application file for complete search history.

(56) References Cited

U.S. PATENT DOCUMENTS

| 5,341,310 | A | * | 8/1994 | Gould et al. ................... 716/13 |
| 5,754,826 | A | | 5/1998 | Gamal et al. |
| 5,977,574 | A | * | 11/1999 | Schmitt et al. ............. 257/207 |
| 6,629,308 | B1 | * | 9/2003 | Baxter .......................... 716/16 |
| 7,073,154 | B1 | * | 7/2006 | Garrison et al. .............. 716/14 |
| 7,205,191 | B2 | * | 4/2007 | Kobayashi .................. 438/238 |
| 2002/0007478 | A1 | * | 1/2002 | Tien .............................. 716/2 |

OTHER PUBLICATIONS

Fang Fang, et al., "Automatic Process Migration Of Datapath Hard IP Libraries", Design Automation Conference, 2004, Proceedings Of The ASP-DAC 2004, Asia and South Pacific Yokohama, Japan Jan. 27-30, 2004, Piscataway, NJ, USA, IEEE, pp. 888-893.

* cited by examiner

*Primary Examiner*—Paul Dinh
*Assistant Examiner*—Nghia M. Doan
(74) *Attorney, Agent, or Firm*—McDermott Will & Emery LLP

(57) ABSTRACT

A method for defining an aligned logic cell grid and interconnect layout of a semiconductor integrated circuit having a logic cell is disclosed. The interconnect layout is resized in accordance with a highest common denominator of an initial routing pitch of the interconnect layout and a transistor pitch of the logic cell. The cell grid is aligned with the resized routing pitch which provides efficient routing density and transistor performance, minimizes excess transistor area and wire routing waste while maximizing cell packing density.

10 Claims, 4 Drawing Sheets

ALIGNED LOGIC CELL GRID AND INTERCONNECT ROUTING ARCHITECTURE

FIELD OF THE INVENTION

This invention relates to integrated circuits, and more particularly to the interconnect layout of transistor pitch and wire routing pitch within a standard cell library architecture for large scale integration of semiconductor integrated circuits.

BACKGROUND

Conventional standard cell library architecture of semiconductor integrated circuits (IC) primarily contain a logic cell layout based in a metal oxide semiconductor environment, in particular a complimentary metal oxide semiconductor (CMOS) environment. Cell library designers strive to maximise the packing density of the logic cells within the standard cell library. Logic cells are composed of transistors that are arranged into base patterns or gate arrays of different types of logical operations, and then fabricated into an application specific IC (ASIC) to perform a specific function. A conventional ASIC layout is typically defined by an array of logic cells arranged in adjacent rows. Such an array is not shown, however, an example of a logic cell 12 is shown in FIGS. 1A-B. The cell is depicted for illustrative purposes as a mask layout design representation that is bound by power and ground rails 3, 5. Such layout design representation is a well known symbolic representation of the physical layout of logic cells. Each logic cell defines a specific logic circuit. The active areas or components of the logic cell include negative-channel diffusion 4, positive-channel diffusion 2, and gate 6 layers. The components of the logic cells are wired internally with vias 8 and metal layer 7 to form simple logic (NMOS and PMOS) gates to perform Boolean and logic functions, for example INVERTER (or NOT) 12, AND, OR, NAND, NOR, XOR, XNOR, ADDERS, FLIP-FLOP, and the like. The general composition and construction of such semiconductor IC physical components are materials well known in the industry, for example gate layer may be polysilicon, and metal layers may be aluminum or copper.

The cell library is typically designed with computer aided design (CAD) applications. The cells and the transistors within the cells are usually interconnected or wired using CAD with a placement and routing tool, typically with at least two metal layers 5, 7 (M1,M2, . . . ). One metal layer is vertically aligned with respect to the components of the cell to form vias 8 to interconnect the components of the cell with another interconnect metal layer (M1,M2, . . . ), which is configured horizontally to distribute power and ground to all cells.

The interconnection layout characteristics include cell pitch 14, transistor pitch 15, and wire track routing pitch 24. Typically transistor pitch is fixed, and cell pitch varies. FIG. 2 shows an array of cells in conventional arrangement showing cell pitch 14 and transistor pitch 15 of an inverter 12, NOR 33 and NAND 31 gate, respectively. Cell pitch is typically a multiple of transistor pitch, for example, an inverter gate 12 as shown in FIGS. 1A-B may be arranged to have a cell pitch that is 2× the transistor pitch. In the design of the interconnection layout, integrated circuit design rules must be observed, for example, minimum width of transistor width, minimum width of metal tracks, minimum spacing between metal tracks, and the like.

In the design of conventional cell library architecture, a mismatch or sub-optimal layout may exist between transistor pitch and routing pitch. Transistor pitch and routing pitch typically have different optimal spacing layouts. Therefore when they are made the same, or aligned, one or the other becomes sub-optimal, and larger than minimum. The sub-optimal layout of conventional transistor/routing pitch may result in inefficient use of IC area impacting IC performance therefore, it is desirable to remove the inefficient layout between transistor and routing pitches. For example, in a practical configuration, the transistor pitch may be 0.36 µm whereas the wire routing pitch may be 0.30 µm. Attempts have been made to match the cell pitch with either the transistor pitch or the wiring pitch, as shown in FIGS. 1A-B.

In FIG. 1A, if the cell pitch 14 is resized to match the wire 22 routing pitch 24 (0.30 µm) as in this configuration 10, the transistor efficiency of the cell 12 is reduced as indicated by wasted transistor area 16. With a cell pitch 14 of 0.30 µm, the routing efficiency is maximised, but the cell 12 must be three grids wide, or 0.90 µm. This reduces transistor efficiency by approximately 20%, compared with the two grids at 0.72 µm width of the initial transistor pitch of 0.36 µm. In other words, since the initial transistor pitch 24 is 0.06 µm greater than the routing pitch, additional grids are required for excess area due to the mismatch.

Alternatively, in FIG. 1B, if the routing pitch 24 is resized to match the cell pitch 14 (0.36 µm) of the cell 12 in this configuration 20, then routing efficiency is reduced as shown by wasted routing area 26. An inverter cell 12, having a cell pitch equal to 2× transistor pitch, may be built at the minimum of 0.72 µm width given a transistor pitch of 0.36 µm, which is only two grids wide, however, the routing efficiency is reduced by 17%. In other words, since the initial routing pitch is less than the transistor pitch, for every resized routing pitch 24 there is 0.06 µm wasted routing area 26.

An associated problem occurs with the routing efficiency when a metal width or spacing greater than the minimum is required which is discussed with reference to FIG. 3. The minimum spacing 34 between metal tracks 22 is defined by integrated circuit design rules. Centre points 32 of adjacent metal tracks 22 are also shown in FIG. 3. Increasing the metal width or spacing is often required to alleviate detrimental conditions due to cross-talk induced delays or glitches, electromigration, sidewall coupling, coupling capacitance, resistance or the like.

FIG. 3 shows a grid 30 defining a conventional routing pitch with (a) conventional spacing, (b) increased spacing 36 to limit cross-talk, and (c) increased metal widths 38 to limit electromigration. In section (a) of FIG. 3, a wiring pitch of 0.30 µm is defined on the routing grid, and metal width and spacing is 0.15 µm.

Conventionally, when increased spacing is required for example to control or limit cross-talk, the router in placement and routing tools of the CAD system places the next adjacent wire on the next grid over as shown in section (b) of FIG. 3. More specifically, the next adjacent metal is placed on the second grid over for space increases of 1.01× and up to 3× of the minimum. This approach is clearly inefficient when a small increase, for example 1.5×, in spacing is required.

In section (c) of FIG. 3, metal width increase may be made from 1.01× to 5×, which results in adjacent metal routes onto the second grid. Similarly, this is inefficient if small increases, for example 1.5×, in width is required. Although with this configuration, a maximum increase of 3× minimum spacing, or 5× minimum width with 3×3 via arrays, is achievable, these limits are excessive and routing efficiency and cell packing density is jeopardised.

Often attempts to reduce the cross-talk by increasing spacing to 1.5×-2× or to avoid electromigration by increasing width to 3× or increasing the number of vias to 2×2, have resulted in a conventional architecture that is inefficient and wasteful with respect to IC area and cell packing density.

There is a need for efficient use of cell architecture interconnection to align transistor pitch and routing pitch to increase wire routing density and cell packing density without compromising transistor performance or wire routing efficiency.

SUMMARY OF THE INVENTION

The invention provides a method for defining an aligned logic cell grid and interconnect layout of a semiconductor integrated circuit having a logic cell, comprising providing a semiconductor integrated circuit having an initial interconnect and an initial cell grid layout logic cell arrangement, the logic cell comprising transistor components having a minimum transistor width defining a transistor pitch, the interconnect layout comprising tracks for interconnecting the transistor components having a track width and track spacing defining an initial routing pitch, the transistor pitch and the initial routing pitch in misalignment; resizing the initial routing pitch in accordance with a fraction of the initial routing pitch to a resized routing pitch to minimize the misalignment and define a resized interconnect layout; and aligning the cell grid with the resized routing pitch to form an aligned cell grid and interconnect layout of the logic cell.

An embodiment of the invention provides that the transistor pitch correlates with an industry standard minimum required for the transistor width, and the initial routing pitch correlates with an industry standard minimum required for wire spacing and width. The initial routing pitch may be resized in accordance with a highest common denominator of the initial routing pitch and the transistor pitch to eliminate the misalignment. The resized routing pitch may be 1/q of the initial routing pitch, where q is an integer that is greater than 1. The resized routing pitch is a quarter of the initial routing pitch. The resized routing pitch may be a fifth, sixth, seventh, etc. of the initial routing pitch.

In another embodiment the highest common denominator selected is based on the minimum pitch between tracks of the initial interconnect layer. A compare routing pitch may be calculated to compare with the resized routing pitch based on the highest common denominator to determine the most desired routing pitch in view of transistor pitch efficiency versus increased run-time due to the number of grids.

DESCRIPTION OF THE DRAWINGS

A device and method for incorporating the present invention will now be described, by way of example only, with reference to the accompanying drawings, in which.

DETAILED DESCRIPTION

Figure 1A:
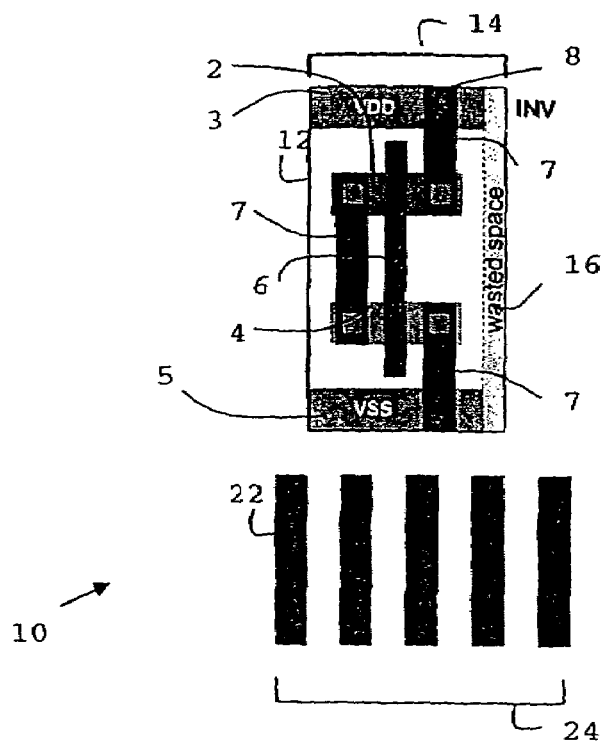
FIG. 1A-B show a reduction in efficiency in a conventional arrangement when the cell pitch is aligned to wire routing pitch and transistor pitch, respectively.
Figure 1B:
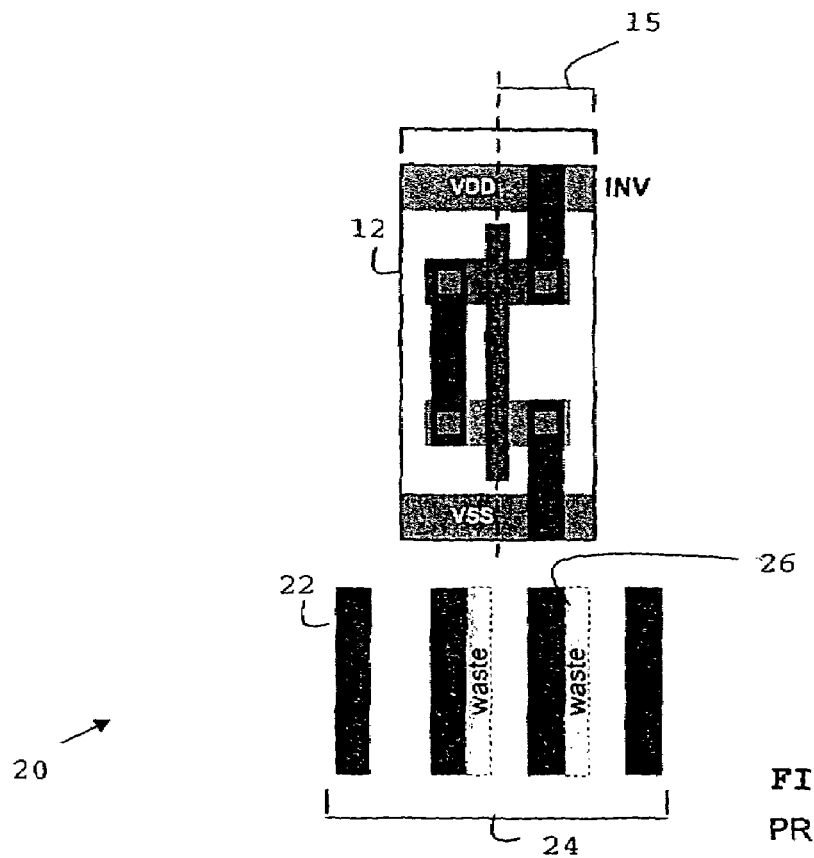
Figure 2:
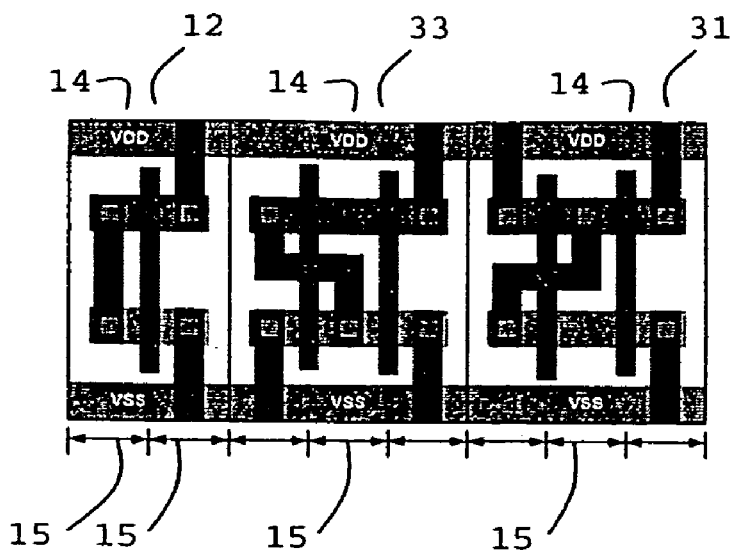
FIG. 2 shows an array of cells in a conventional arrangement showing cell pitch and transistor pitch of an inverter, NOR and NAND gate, respectively.
Figure 4:
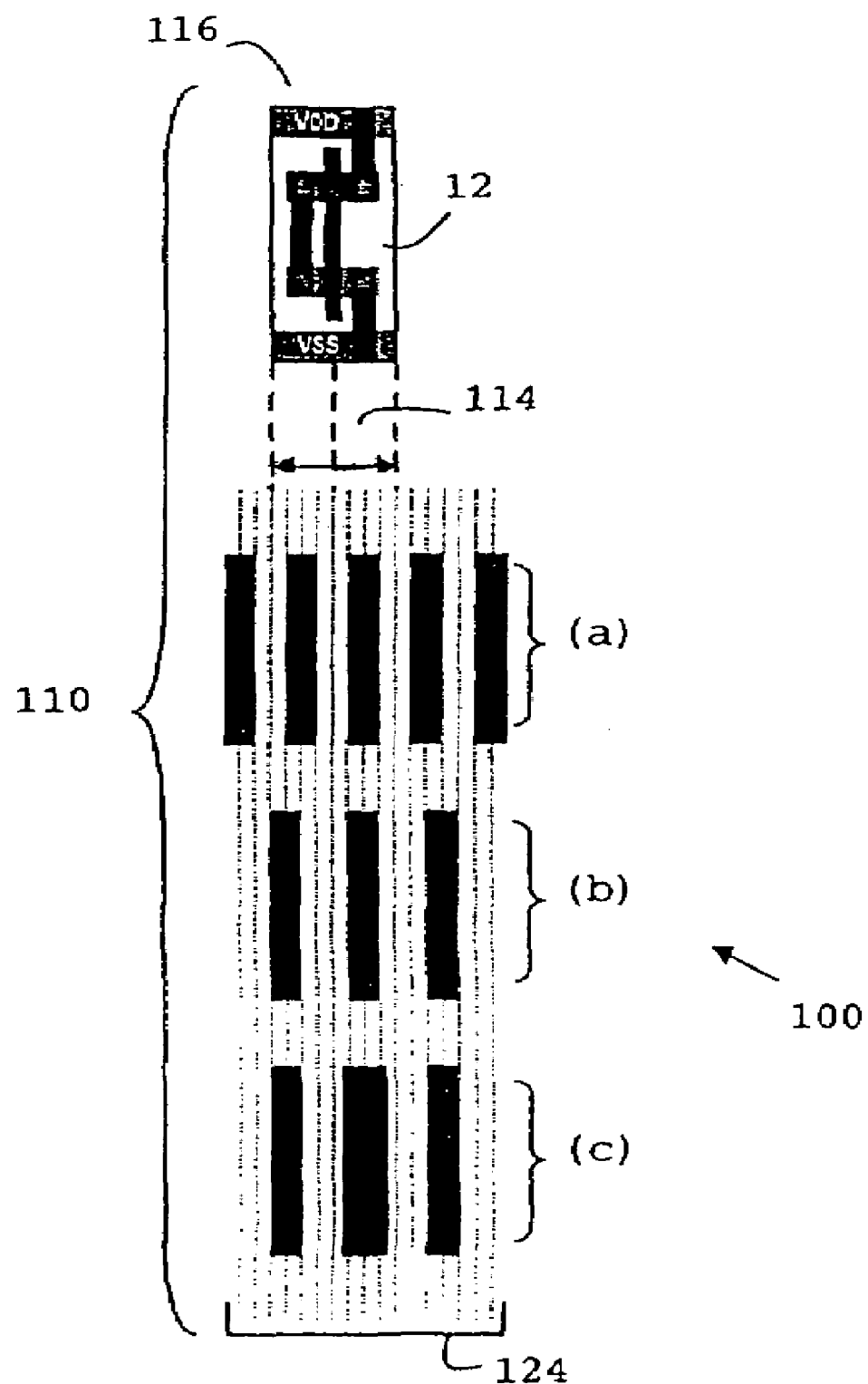
FIG. 4 shows a grid for a design of logic cell architecture having a cell pitch aligned with a reduced grid routing pitch in accordance with an embodiment of the invention.

FIG. 4 is a grid 100 for a logic cell 12 having a cell pitch 110 aligned with a reduced grid routing pitch 124 in accordance with an embodiment of the invention. The routing pitch is defined by a highest common denominator of the transistor pitch 114 and the routing pitch 24 as discussed with FIG. 1A. It will be appreciated that the highest common denominator is an example and is not necessarily the factor chosen to define the routing pitch, as discussed in more detail below. For the purpose of illustrating this embodiment of the invention, references and comparisons are made to FIG. 1A.

In an embodiment, the reduced routing pitch 124 is equivalent to 1/q of the initial routing pitch 24 where q is an integer. In this embodiment ¼ is shown. It will be appreciated that other reduced routing pitches may be chosen, for example ⅕, ⅙, or the like. Similarly, increased routing pitches ½ or ⅓ may be chosen, however, the granularity may not be sufficiently small The reduced routing pitch is a finer grid, and provides improved granularity and increases cell packing density. For example, the cell width may be reduced by up to ¾ or ½ or ¼ of a full grid in area, when compared with the cell width prior to the reduced routing pitch.

A general method to determine the appropriate wiring and cell pitch is $R=P*q$, $P=n*M$, and $T_{new}=P*k$, where R is the natural routing pitch, T is the natural transistor pitch and M is the manufacturing grid. R, T and M are all conventionally determined by technology. An integer (q) is chosen to determine P and P is checked to make sure scalable by integer (n) on the manufacturing grid (M). $T_{new}$ is determined with another integer (k) such that k is selected to provide $T_{new}$ is equal to or greater than (as close as possible) to T. Preferably $T_{new}=T$ such that transistor efficiency is 100%.

As shown in FIG. 4(a), the cell pitch 110 is aligned with the reduced routing pitch 124. In this embodiment, the resulting reduced routing pitch 124 with best transistor pitch efficiency is ¼ of the standard width of 0.28 µm which equates to 0.070 µm. The natural transistor pitch (T) is 0.35 µm and the manufacturing grid (M) is 0.005 µm. With a q of 2, P=0.14 µm (with n=28), and $T_{new}=0.42$ (≧T, where k=3), the transistor efficiency is only 83% (0.35/0.42). With a q of 3, P=0.0933 . . . , which is not achievable on the manufacturing grid (M) so a q of 3 is invalid in this example. With a q of 4, P=0.07 µm (with n=14) and $T_{new}=0.35$ µm (which is equal to T with k=5). Therefore, a q=4 is the most desirable solution for this example, since transistor pitch efficiency is 100%. Accordingly, the inverter cell 12 is 0.70 µm (10 grids*0.07 µm) wide instead of 0.84 µm (3 grids*0.28 µm) achieved in FIG. 1A. With this configuration, the realised improvement, i.e. reduction, is half of a grid width, or 20%. Also, the cell width of 0.70 µm is equal to the total minimum width of the cell of 0.70 µm. There is no wasted transistor area 116.

In another example, a q of 5 provides a transistor efficiency of 100%, when R=0.3 µm, T=0.36 µm, and M=0.005 µm. With a q of 2, P=0.15 µm (with n=30) and $T_{new}=0.45$ µm (≧T with k=3) the transistor efficiency is 80%. With a q of 3, P=0.10 µm (with n=20), and $T_{new}=0.40$ µm, (≧T with k=4) the transistor efficiency is 90%. With a q of 4, P=0.075 µm (with n=15), and $T_{new}$=0.375 ($\geq$T with k=5) the transistor efficiency is 96%. With a q of 5, P=0.06 (with n=12) and $T_{new}$=0.36 (=T, with k=6), the transistor efficiency is 100%. However, relative to a q=4, improving transistor efficiency by just 4% may not justify increasing runtime for 25% more grids, i.e. 5/4. Therefore in this example a q of 5 may not provide the most desirable solution and a q of 4 may be chosen instead.

In both examples, the highest common denominator provided a transistor efficiency of 100%. Another method for determining the appropriate wiring and cell pitch is to determine the highest common denominator (hcd) by n=hcd ((R/M),(T/M)), where q=R/M/n and q$\geq$4 is chosen for sufficient granularity. In the first example n=hcd(56,70)=14 and q=56/14=4. In, the second example n=hcd(60,72)=12 and q=60/12=5. However, as discussed above, a q of 4 may be more desirable in view of runtime increase associated with more grids. Therefore, if the method of determining highest common denominator is used to determine the appropriate wiring and cell pitch, then a smaller q may be selected, for example a q of ($q_{hcd}$-1) may be determined for considering transistor efficiency savings compared with any impact to run time.

It will be appreciated that this embodiment is clearly useful for logic cells having smaller widths, for example 2× or 3× natural transistor pitch, which are also often the most frequently used cells in conventional cell library architecture. Regarding larger cells, for example 10× initial pitch, a reduction of 1/4, 1/2, 3/4, etc. of a grid is a small percent saving, however, such larger cells are typically not used as frequently as smaller cells.

Figure 3:
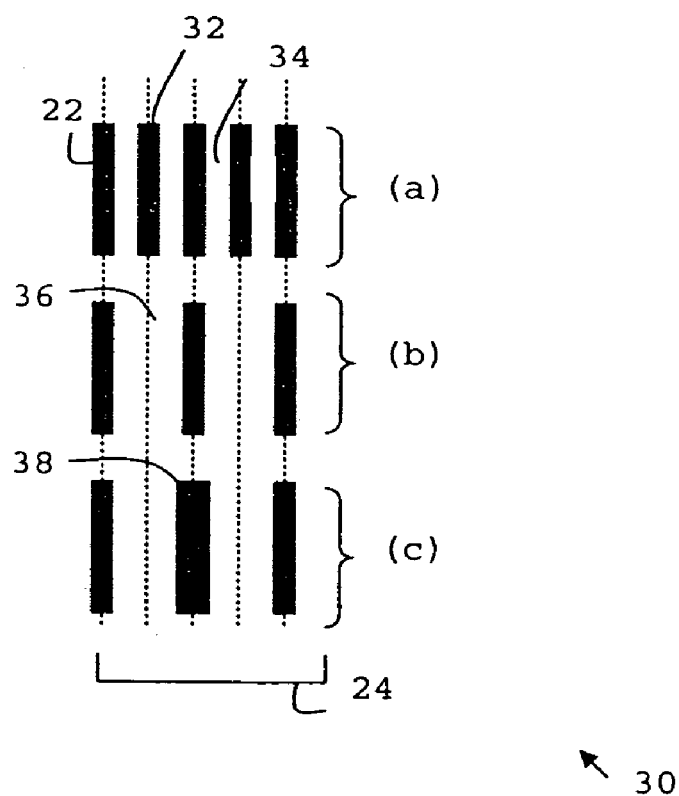
FIG. 3 shows a grid defining a conventional routing pitch with (a) conventional spacing, (b) increased spacing to limit cross-talk, (c) increased metal widths to limit electromigration.

With this configuration, another benefit realised is in the routing density. An increase in width or spacing of a wire track still forces the adjacent wire onto another routing grid, however the next adjacent grid is only a quarter of the full original pitch 24 away. Thus, the most common width and spacing increases of 1.5× or 2× of minimum width may be accommodated by minimising any waste in routing efficiency, as shown in (b) or (c) of FIG. 4 when compared with (b) or (c) of FIG. 3, respectively. The increased granularity of the reduced routing pitch limits any waste in routing area. It will be appreciated that even if the initial transistor pitch and the initial routing pitch match or are aligned, benefits may still be realised as discussed by reducing the routing pitch when the wire spacing or width is changed or resized, in particular increased.

In a conventional routing and placement tool, each minimum width/spacing wire in this embodiment "appears" to be 2× larger in width and spacing. For example, in this configuration the minimum wire width and spacing are 2× quarter grid pitches (i.e., minimum spacing=2×, minimum width=2×, therefore pitch=4×). It will be appreciated that this appearance of the minimum width and spacing wire may readily be handled by conventional placement and routing tools without requiring any sub-divisions of the base grid. One recognized trade off with an embodiment is CAD run time, which for small to medium size blocks in an IC is a minor fraction of total billed time.

Figure 5:
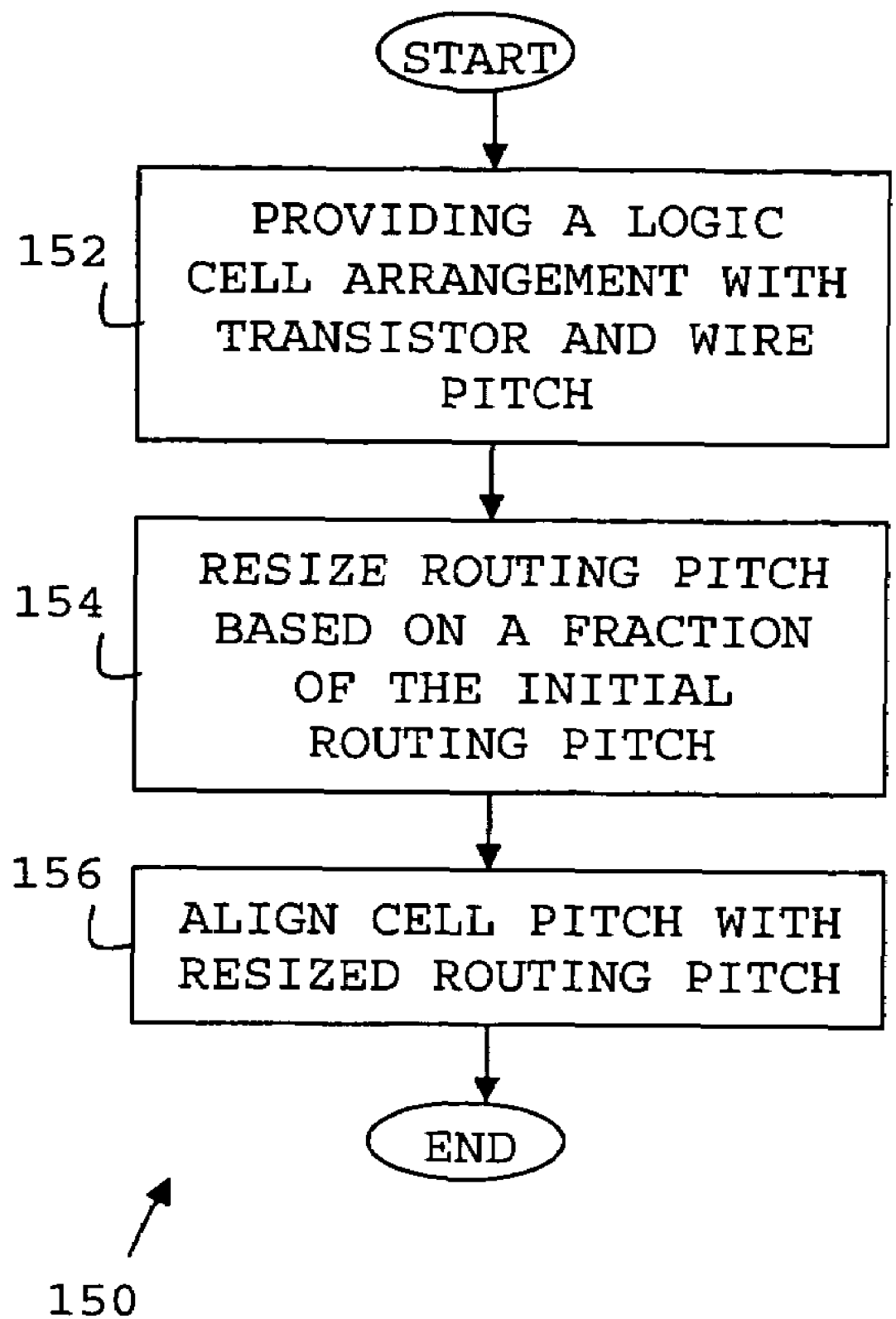
FIG. 5 shows a flow chart of a method in accordance with an embodiment of the invention.

FIG. 5 shows a flow chart of a method in accordance with an embodiment of the invention. As discussed above, an embodiment may be implemented on a logic cell arrangement having a wire routing pitch and a transistor pitch 152. The routing pitch of the wires is reduced 154. The reduction of the routing pitch is based on the highest common denominator of the original wire pitch and transistor pitch. The cell pitch is aligned 156 with the reduced routing pitch.

An embodiment of the invention may be implemented with computer aided design (CAD) systems that are well known to a skilled person. Well known hardware description languages (HDL), such as Very High Speed Integrated Circuit Hardware Description Language (VHDL) and VERILOG, both international standard languages of Institute of Electrical and Electronic Engineers, Inc. (IEEE), may be used to implement embodiments of the invention to describe an ASIC, which is then synthesized into detailed logic functions comprising standard cells. An example of a tool to perform the synthesis is DESIGN COMPILER. (DESIGN COMPILER is a trademark in certain countries of Synopsys, Inc. of Mountain View, Calif., United States of America). The cell library may also be designed with modelling tools or logic schematic programs on a CAD system to create symbolic representations such as a layout of logic functions, for example, VIRTUOSO (VIRTUOSO is a trademark in certain countries of Cadence Design Systems, Inc., of San Jose, Calif., United States of America). Of course, the ASIC may be built in rows of standard cells as mentioned above, or by other techniques known such as custom transistor level layout or the like. ASIC developers may use "place and route" (P&R) tools to reset the pitches of the cells as required for increasing the applicability of the technique. The placement and routing tools generate the associated mask patterns to physically wire the standard cells in the manner required to implement the ASIC function. While placement tools provide initial placement of cells in a block or IC when the routing needs are estimated, routing tools are capable of moving cells from their initial placement once the routing needs are known. Examples of "place and route" tools that may be used are PHYSICAL COMPILER and ASTRO, respectively (PHYSICAL COMPILER and ASTRO are trademarks in certain countries of Synopsys, Inc.). The hardware and software required to implement the invention, and indicated for explaining the preferred embodiment should not be limiting. Similarly, the software processes running on them may be arranged, configured or distributed in any manner suitable for performing the invention defined by the claims.

An embodiment may be implemented with standard CAD applications well known to a skilled person. The placement and routing tool may be any number of products for physical implementation synthesis, for example, ASTRO and PHYSICAL COMPILER by Synopsys, Inc. of Mountain View, Calif., United States of America.

It will be understood that the system and method for designing aligned cell grid and routing architecture as described above provides advantages, such as efficient routing density and transistor performance, alignment of the cell grid with the interconnect layout, minimising excess transistor area and wire routing waste, and increased cell packing density. It will be appreciated that specific embodiments of the invention are discussed for illustrative purposes, and various modifications may be made without departing from the scope of the invention as defined by the appended claims.

What is claimed is:

1. A method for defining an aligned logic cell grid and interconnect layout of a semiconductor integrated circuit having a logic cell, comprising:

providing a semiconductor integrated circuit having an initial interconnect and an initial cell grid layout logic cell arrangement, the logic cell comprising transistor components having a minimum transistor width defining a natural transistor pitch, the interconnect layout comprising tracks for interconnecting the transistor components having a track width and track spacing defining an initial routing pitch, the natural transistor pitch and the initial routing pitch in misalignment;

resizing the initial routing pitch to a resized routing pitch by scaling the initial routing pitch by a fraction $1/q$, wherein q is an integer greater than 1 and wherein q is selected such that the resized routing pitch is scalable on a manufacturing grid;

resizing the natural transistor pitch to a resized transistor pitch by scaling the resized routing pitch by an integer k, wherein k is selected such that the resized transistor pitch is greater than or equal to the natural transistor pitch; and aligning the cell grid having the resized transistor pitch with the interconnect layout having the resized routing pitch to form an aligned cell grid and interconnect layout of the logic cell.

2. The method of claim 1 wherein the natural transistor pitch correlates with an industry standard minimum required for the transistor width, and the initial routing pitch correlates with an industry standard minimum required for wire spacing and width.

3. The method of claim 1 wherein the initial routing pitch is resized in accordance with a highest common denominator of the initial routing pitch and the natural transistor pitch to eliminate the misalignment.

4. The method of claim 3 wherein the highest common denominator selected is based on the minimum pitch between tracks of the initial interconnect layout.

5. The method of claim 4 further comprising calculating a compare routing pitch to compare with the resized routing pitch based on the highest common denominator to determine the most desired routing pitch in view of transistor pitch efficiency versus increased run-time due to the number of grids.

6. The method of claim 3 further comprising calculating a compare routing pitch to compare with the resized routing pitch based on the highest common denominator to determine the most desired routing pitch in view of transistor pitch efficiency versus increased run-time due to the number of grids.

7. The method of claim 1 wherein the resized routing pitch is a quarter of the initial routing pitch.

8. The method of claim 1 wherein the resized routing pitch is a fifth of the initial routing pitch.

9. The method of claim 1 wherein the resized routing pitch is a sixth of the initial routing pitch.

10. The method of claim 1 wherein the resized routing pitch is a seventh of the initial routing pitch.

* * * * *